United States Patent [19]

Yamada et al.

[11] Patent Number: 4,853,797

[45] Date of Patent: Aug. 1, 1989

[54] FIR TYPE DIGITAL FILTER FOR RECORDING AND REPRODUCING APPARATUS

[75] Inventors: Makoto Yamada; Kentaro Odaka, both of Tokyo, Japan

[73] Assignee: Sony Corporation, Tokyo, Japan

[21] Appl. No.: 160,483

[22] Filed: Feb. 25, 1988

[30] Foreign Application Priority Data

Feb. 26, 1987 [JP] Japan .............................. 62-P043808
Aug. 21, 1987 [JP] Japan .............................. 62-P207860

[51] Int. Cl.[4] ...................... G11B 20/10; G11B 20/22; G11B 5/09
[52] U.S. Cl. ......................................... 360/32; 360/65
[58] Field of Search .............................. 360/32, 51, 65

[56] References Cited

U.S. PATENT DOCUMENTS 4,646,173 2/1987 Kammeyer et al. ................... 360/51

FOREIGN PATENT DOCUMENTS 0109674 5/1984 European Pat. Off. .............. 360/32
0155101 9/1985 European Pat. Off. .............. 360/32
0155664 9/1985 European Pat. Off. .............. 360/32

*Primary Examiner*—Vincent P. Canney
*Assistant Examiner*—Kevin J. Fournier
*Attorney, Agent, or Firm*—Alvin Sinderbrand

[57] ABSTRACT

In a recording/reproducing apparatus, having an analog-to-digital converter used in a recording mode and a digital-to-analog converter used in a reproducing mode; a digital filter comprises memories for storing first and second multiplication coefficient groups which provide predetermined filter characteristics and are in interpolated relation to each other; and, in the recording mode for first-and second-channel signals, the first and second multiplication coefficient groups are used for the first- and second-channel signals, respectively, and, in the reproducing mode, the second-and first-multiplication coefficient groups are used for the first-and second-channel signals, respectively. In recording and reproducing modes for a single-channel signal, the first and second multiplication coefficient groups are alternately used for successive samplings.

7 Claims, 6 Drawing Sheets

FIR TYPE DIGITAL FILTER FOR RECORDING AND REPRODUCING APPARATUS

BACKGROUND OF THE INVENTION

I. Field of the Invention

The present invention relates to a digital filter and, more particularly, to a digital filter used for a digital recording/reproducing apparatus.

II. Description of the prior art

Recently, a digital recording/reproducing apparatus such as a digital audio tape (DAT) recorder has been developed. In such an apparatus, as shown in FIG. 1, in a recording mode, L- and R-channel analog audio signals $S_L$ and $S_R$ respectively supplied to input terminals 1 and 2 are converted into digital audio signals by a common A/D converter 5 to which audio signals $S_L$ and $S_R$ are respectively passed through low-pass filters 3 and 4. In such case, in the A/D converter 5, oversampling is performed at a frequency $2f_s$ which is twice a normal sampling frequency $f_s$. In such oversampling, the signals $S_L$ and $S_R$ are alternately sampled in the order of $S_L$, $S_R$, $S_L$, $S_R$, ..., starting from $S_L$. Therefore, in order to obtain a sampling rate of $2f_s$ for each of the two-channel signals, a sampling clock having a frequency of $2f_s \times 2$ is supplied to the A/D converter 5.

The 2-channel digital signals obtained from the A/D converter 5 are supplied to a digital low-pass filter 6 (to be hereinafter referred to simply as a "digital filter"). In the digital filter 6, the sampling rate of $2f_s$ is converted to a normal sampling rate of $f_s$. Thereafter, the digital signals are supplied to a digital recording and reproducing circuit 7, and are thereby recorded on a magnetic tape.

In a reproducing mode, the L- and R-channel digital signals reproduced from the magnetic tape are supplied from the recording and reproducing circuit 7 to the digital filter 6, and are sampled at the sampling rate of $f_s$. Thereafter, the digital signals are supplied to a common D/A converter 8. Sampling is started from the L channel at the sampling rate of $2f_s$, and the digital signals are alternately oversampled in the order of L, R, L, R, ... to be converted to analog signals. The analog signals are passed through low-pass filters 9 and 10 to output terminals 11 and 12 and are derived from the latter as original 2-channel signals $S_L$ and $S_R$.

By reason of the oversampling performed by the A/D converter 5 in the recording mode and by the D/A converter 8 in the reproducing mode, the design of the low-pass filters 3, 4, 9 and 10 can be facilitated. In this connection, if it is assumed that the analog audio signals $S_L$ and $S_R$ have a bandwidth of about 0 to $f_s/2$, as shown in FIG. 2A, then recording and reproducing signals supplied to and from the recording and reproducing circuit 7 have attenuation characteristics near $f_s/2$ and $3f_s/2$, as shown in FIG. 2B.

For the digital filter 6, there is employed a filter having filter characteristics for attenuating an input within the range of $f_s/2$ to $3f_s/2$, as shown in FIG. 2C. Therefore, each of the low-pass filters 3, 4, 9 and 10 can allow a signal as shown in FIG. 2A to pass therethrough and can fully remove a signal of $3f_s/2$ or higher shown on FIG. 2C. For example, the filters 3, 4, 9 and 10 can have a moderate attenuation characteristic curve as indicated by a dotted line in FIG. 2D. For this purpose, design of the low-pass filters 3, 4, 9 and 10 can be facilitated, thus providing practical advantages in respect of signal distortion and cost. In the above case, the oversampling frequency is set to be twice the normal frequency $f_s$. If the magnification of the oversampling is further increased, the inclination of the characteristic curve of each low-pass filter 3, 4, 9 or 10 can be further decreased.

In the above-mentioned digital recording/reproducing apparatus, it is preferable that L- and R-channel signals be alternately recorded on the magnetic tape without a phase difference therebetween.

In the circuit shown in FIG. 1, in the recording mode, the signals $S_L$ and $S_R$ passing through the low-pass filters 3 and 4 are alternately sampled, in the order of L, R, ..., starting from the L channel, by the A/D converter 5, and are supplied to the digital filter 6. In this digital filter 6, L- and R-channel signal processing operations are started at the same time. For this reason, the L-channel signal output from the digital filter 6 is phase-delayed relative to the R-channel signal output therefrom, and these signals are recorded on the magnetic tape with a phase difference.

In the reproducing mode, the 2-channel signals which are recorded on the magnetic tape with no phase difference are reproduced, and are simultaneously subjected to signal processing by the digital filter 6. Thereafter, these signals are alternately sampled by the D/A converter 8 in the order of L, R, ..., starting from the L-channel. As a result, the L-channel signal output from the D/A converter 8 is phase-advanced relative to the R-channel signal output. The 2-channel reproducing signals having a phase difference are supplied to 2-channel loudspeakers, thus impairing the stability and stereoscopic sound effects.

In order to solve the above problems, separate A/D and D/A converters can be provided for each of the 2-channel signals, that is, the L- and R-channel signals. However, the circuit arrangement is thereby complicated and the cost is increased.

Japanese Patent Laid-Open (Kokai) No. 60-242717 discloses a technique for reproducing signals while matching L- and R-channel phases. However, this patent does not describe a recording/reproducing apparatus at all.

OBJECTS AND SUMMARY OF THE INVENTION

It is a first object of the present invention to provide a digital filter which can obtain 2-channel signals without a phase difference in a recording/reproducing mode.

It is another object of the present invention to provide a digital filter which can change the magnification of oversampling with respect to a single-channel signal using the same circuit arrangement as may be employed for processing 2-channel signals.

It is a further object of the present invention to provide a digital filter which can remove a phase difference between 2-channel signals in recording and reproducing modes such that multiplication coefficient groups for defining filter characteristics of a digital filter are suitably switched for the L-/R-channel signals.

DETAILED DESCRIPTION OF THE PREFERRED EMBODIMENT

Figure 3:
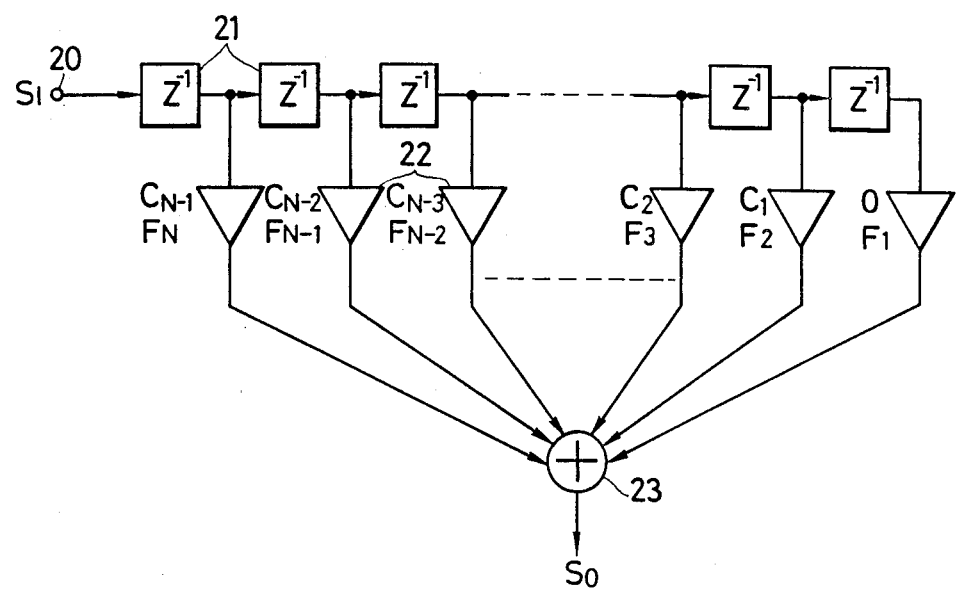
FIG. 3 is a block diagram schematically showing a digital filter when 2-channel signals are recorded/reproduced.

FIG. 3 schematically shows finite impulse response (FIR) type digital filter used for recording/reproducing 2-channel signals. An L- or R-channel input digital signal $S_I$ supplied to an input terminal 20 sequentially passes through N series-connected delay elements 21. The delay time of each delay element 21 is set to be one sampling period $\frac{1}{2}f_s$ when double-rate oversampling is performed.

Figure 2A:
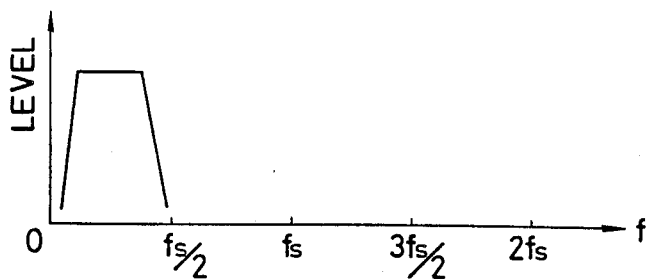
FIGS. 2A to 2D are graphs illustrating characteristics of the circuit shown in FIG. 1.
Figure 2B:
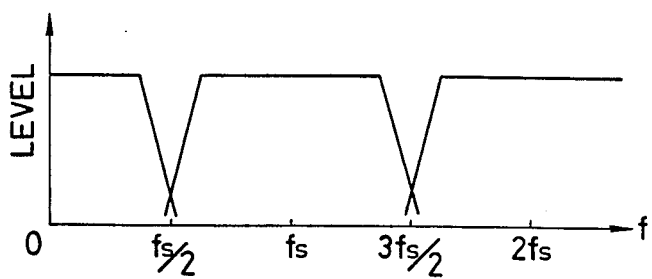
Figure 2C:
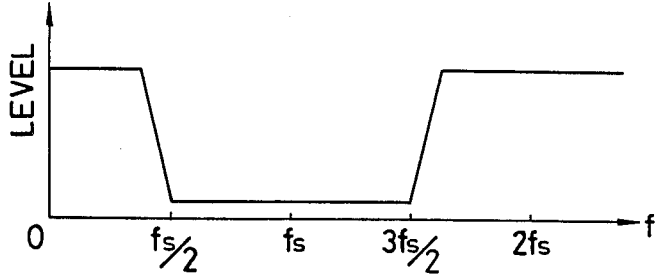

Outputs from the N delay elements 21, respectively, are multiplied and weighted with respective predetermined multiplication coefficients by corresponding coefficient devices 22, and then are summed by an adder 23 to provide an output signal $S_O$. The output signal $S_O$ has predetermined filter characteristics for example, as shown in FIG. 2C with respect to the input signal $S_I$. The coefficient devices 22 have two groups of multiplication coefficients, that is, a C coefficient group comprised of 0, $C_1$, $C_2$, ..., $C_{N-2}$, $C_{N-1}$, and an F coefficient group comprised of $F_1$, $F_2$, ..., $F_N$. The coefficient devices 22 select and use one of the first and second, or C and F multiplication coefficient groups.

More particularly, in the digital filter being now described with reference to FIG. 3, in the mode for recording 2-channel signals, if the input signal $S_I$ is an L-channel signal, the C coefficient group is used, and, if the input signal $S_I$ is an R-channel signal, the F coefficient group is used. In the mode for reproducing of the 2-channel signals, if the input signal $S_I$ is the L-channel signal, the F coefficient group is used, and if the input signal $S_I$ is the R-channel signal, the C coefficient group is used.

Figure 4:
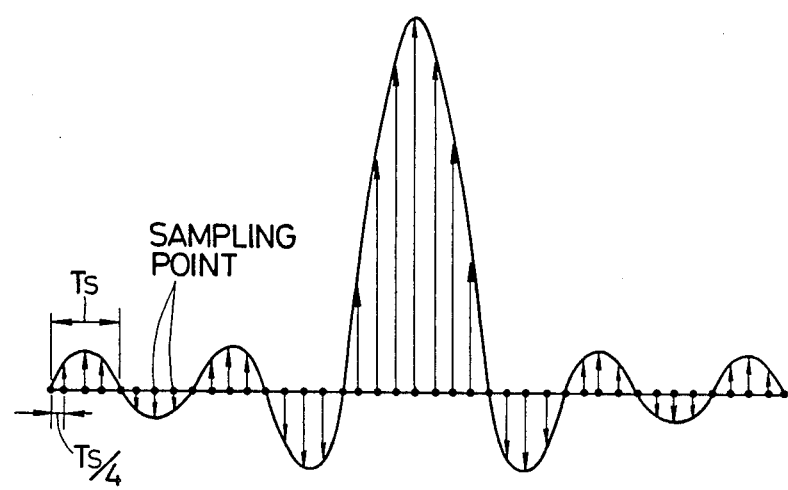
FIG. 4 is a graph showing impulse response characteristics of a digital filter.

FIG. 4 shows an example of impulse response characteristics of the digital filter shown on FIG. 3.

The response characteristics represent a change in time of the output signal $S_O$ when an impulse is applied to the input terminal 20. More specifically, the impulse is sequentially delayed by the delay elements 21, and the respective delayed outputs are weighted by the corresponding coefficient devices 22. Thereafter, these outputs are sequentially output through the adder 23.

In these impulse response characteristics, the interval between successive sampling points (output timings of the delay elements 21) is TS/4 ($\frac{1}{4}f_s$). The length of an arrow at each sampling point on FIG. 4 corresponds to an impulse having a size corresponding to the coefficient of each coefficient device 22. The coefficients of the coefficient devices 22 are selected as described above, so that the obtained filter characteristics in the case of a double or four-times oversampling rate are as shown in FIG. 2C described above or in FIG. 7A to be described later.

Figure 1:
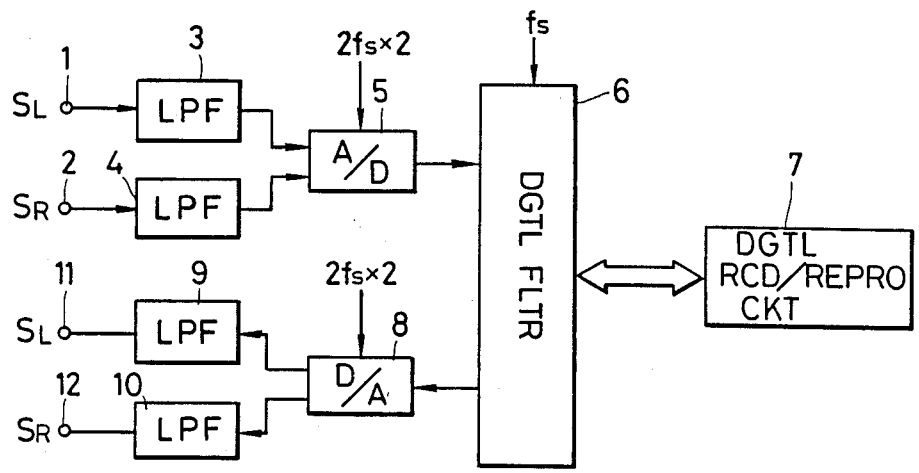
FIG. 1 is a block diagram showing a digital recording/reproducing apparatus according to the prior art.

As described above, in the 2-channel signal recording mode of the apparatus shown on FIG. 1, the digital filter 6 simultaneously starts signal processing for signals supplied from the A/D converter 5 in the order of L, R, .... Therefore, the L-channel signal output from the digital filter 6 is delayed relative to the R-channel signal output. The delay amount is Ts/4 with respect to $\frac{1}{2}$ of a sampling period $2f_s$, i.e., a normal sampling period $T_s$ ($=1/f_s$). Therefore, the digital filter 6 can perform correction such that the R-channel signal is delayed by $T_s/4$ with respect to the L-channel signal. For this purpose, a curve of the impulse response characteristics of the R-channel digital filter 6 can be delayed by $T_s/4$ relative to the curve of the response characteristics of the L-channel digital filter 6.

Figure 5:
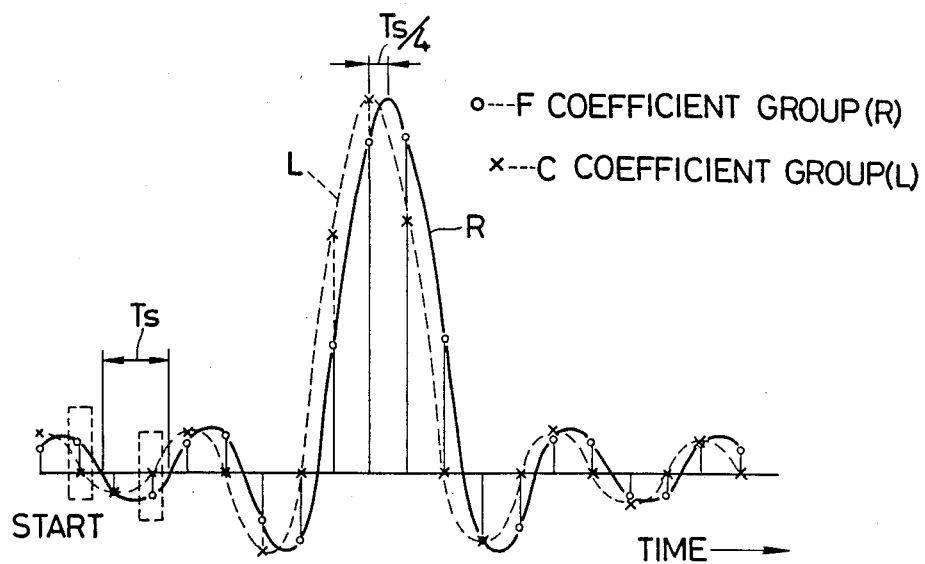
FIG. 5 is a graph showing impulse response characteristics for L and R channels in the recording mode.

FIG. 5 shows impulse response characteristics of the digital filter in a digital signal recording mode based on the above principle. A solid-line curve R indicated by "o" represents characteristics of the R-channel digital filter, and a dotted-line curve L indicated by "x" represents characteristics of the L-channel digital filter. The curve R is delayed by $T_s/4$ relative to the curve L. The size height of an impulse from a reference level is indicated by "o" and "x" for the curves R and L, respectively, and is determined such that "o" is determined by the F coefficient group and "x" is determined by the C coefficient group. The coefficients of the C and F coefficient groups are equivalent to the alternate arrows in FIG. 4. In other words, in accordance with this invention, alternate sampling points in FIG. 4 are selected to be classified into the C and F coefficient groups, and these coefficient groups are respectively used for the L and R channels. Therefore, the coefficients of the C and F coefficient groups in FIG. 5 are interpolated with each other with respect to the total characteristics of the digital filter shown in FIG. 4. Note that signal processing is simultaneously started for the L- and R-channel signals. In order to convert the sampling rate $2f_s$ from the A/D converter 5 into a sampling rate $f_s$, every other data, for example, as enclosed in dotted lines at the left-hand portion of FIG. 5, are not output in practice.

In the reproducing mode for 2-channel signals recorded as described above, the 2-channel signals which are recorded on the magnetic tape without a phase difference are simultaneously subjected to signal processing by the digital filter 6 and are alternately sampled by the D/A converter 8 in the order L, R, .... In this case, the R-channel signal output from the D/A converter 8 would be delayed relative to the L-channel signal by $T_s/4$. Therefore, the digital filter 6 is made to perform correction such that the L-channel signal is delayed by $T_s/4$ relative to the R-channel signal. For this purpose, the curve of the impulse response characteristics of the L-channel digital filter 6 can be delayed by $T_s/4$ relative to the curve of the impulse response characteristics of the R-channel digital filter 6.

Figure 6:
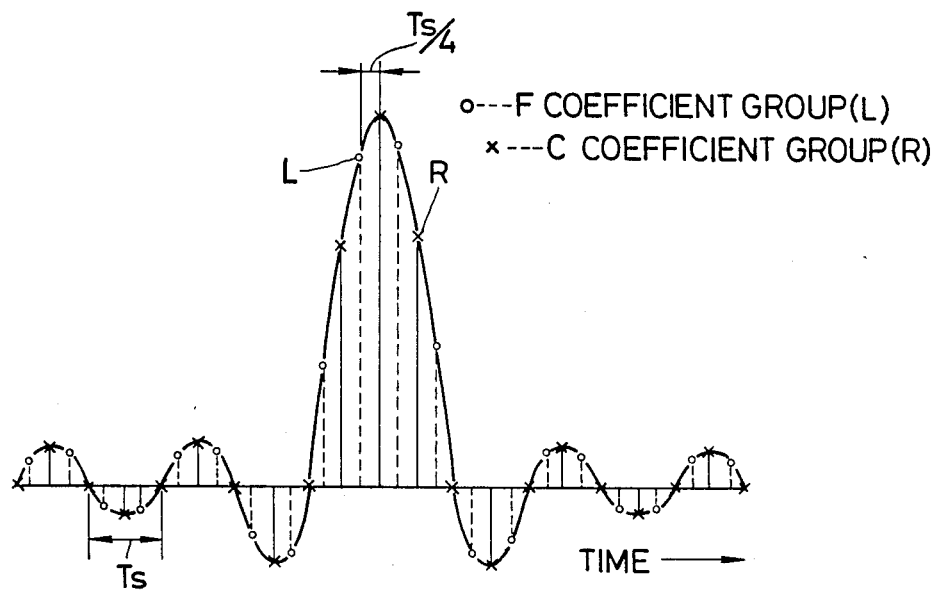
FIG. 6 is a graph showing impulse response characteristics for L and R channels in the reproducing mode.

FIG. 6 shows impulse response characteristics of the digital filter in a 2-channel signal reproducing mode based on the above principle. A curve L indicated by "o" represents characteristics of the L-channel digital filter, and a curve R indicated by "x" represents characteristics of the R-channel digital filter. The curve L is delayed by $T_s/4$ from the curve R. The size or height of an impulse measured from a reference level and indicated by "o" and "x" is determined such that "o" is determined by the F coefficient group and "x" is determined by the C coefficient group. The coefficients of the C and F coefficient groups are set to interpolate with each other to provide the total characteristics of the digital filter shown in FIG. 4. In order to convert a signal of the sampling rate $f_s$ from the digital filter 6 into a sampling rate twice $f_s$, i.e., $2f_s$, by means of the D/A converter 8, the recording and reproducing circuit 7 inserts zero data between successive data samples and supplies the resulting data to the digital filter 6.

The recording/reproducing of a single-channel signal will now be described.

In FIG. 1, the terminal 1 and the low-pass filter 3 or the terminal 2 and the low-pass filter 4 are omitted, and the terminal 11 and the low-pass filter 9 or the terminal 12 and the low-pass filter 10 are omitted. In such case, a single-channel input signal such as a monaural audio signal is supplied to the terminal 1 or 2, and a monaural reproduced analog audio signal is derived from the terminal 11 or 12.

In the recording mode, a signal obtained from the low-pass filter 3 or 4 is converted by the A/D converter 5 to have a sampling rate $4f_s$. A signal which is oversampled at four-times the normal sampling rate is converted by the digital filter 6 to have a sampling rate $f_s$, and is then supplied to the recording and reproducing circuit 7. It should be noted that, in order to convert the sampling rate $4f_s$ into $f_s$, every fourth data are output.

In the reproducing mode, a signal reproduced by the recording and reproducing circuit 7 is supplied to the D/A converter 8 through the digital filter 6, and is converted from $f_s$ to a sampling rate $4f_s$. Thereafter, the signal is supplied to the low-pass filter 9 or 10. It should be noted that, in order to convert a signal of sampling rate $f_s$ from the digital filter 6 into a signal of a sampling rate $4f_s$ by means of the D/A converter 8, the recording and reproducing circuit 7 output data at every fourth sampling point and inserts zero data therebetween, and the resultant data is supplied to the digital filter 6.

Figure 2D:
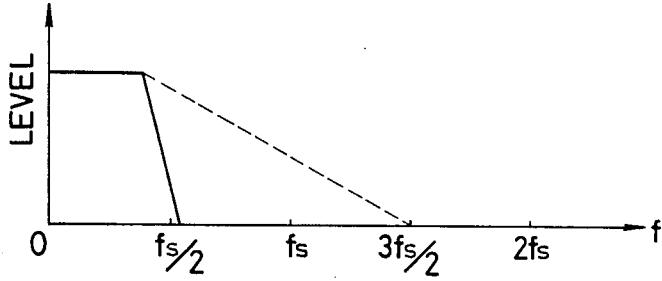
Figure 7A:
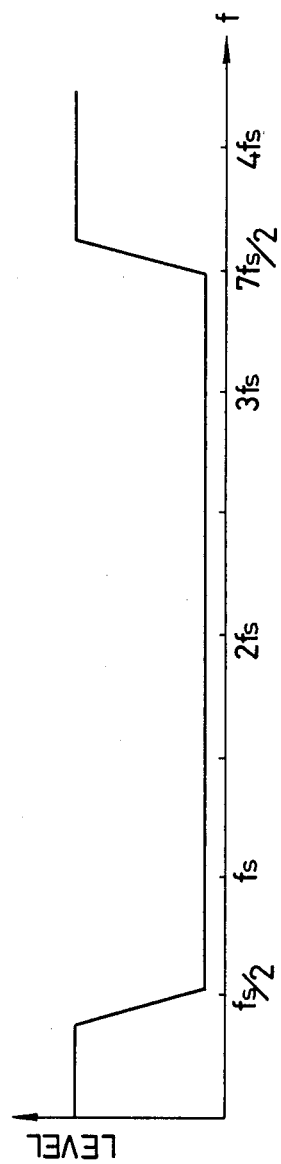
FIGS. 7A and 7B are graphs showing filter characteristics when four-times the normal rate oversampling is performed.
Figure 7B:
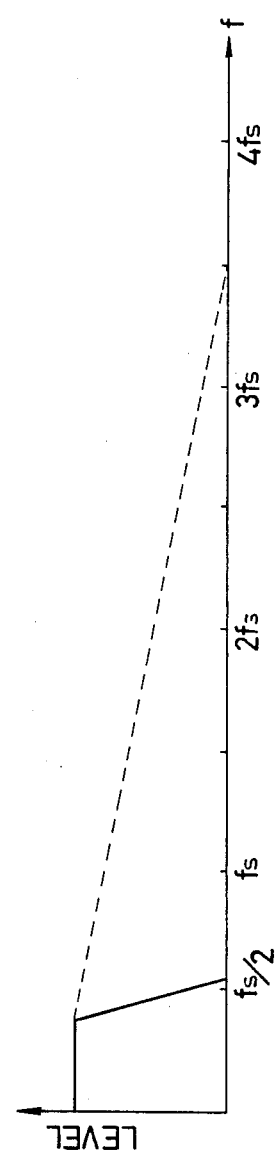

As described above, the digital filter 6 is used without modification, and a monaural signal can be oversampled at a four-times normal sampling rate without changing the clock frequency supplied to the A/D converter 5, the D/A converter 8 and the digital filter 6. The filter characteristics of the digital filter 6 in this case have attenuation characteristics within the range of $f_s/2$ to $7f_s/2$, as shown in FIG. 7A. Therefore, the low-pass filters 3, 4, 9 and 10 can have attenuation characteristics whose inclination is smaller than that of FIG. 2D, for example, as indicated by a dotted line in FIG. 7B. In the schematic view of the digital filter, all the coefficients of F and C coefficient groups shown in FIG. 3 are used and are alternately set.

Figure 8:
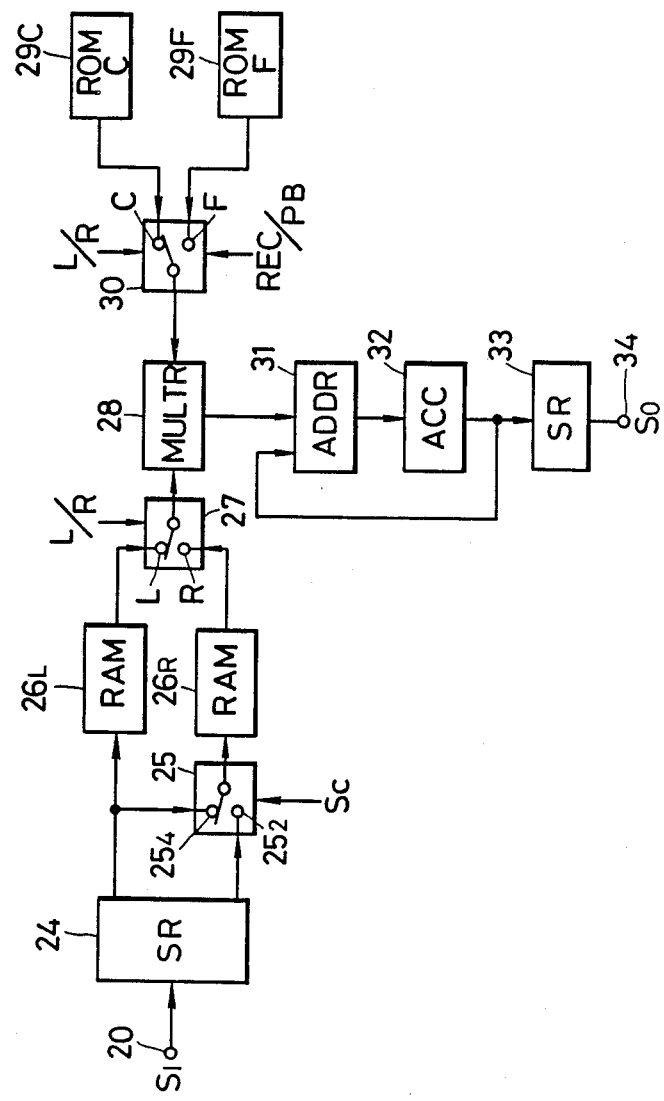
FIG. 8 is a block diagram showing an embodiment of the present invention.

FIG. 8 shows an embodiment of a digital filter for obtaining the filter characteristics shown in FIGS. 2C and 7A.

In FIG. 8, an input terminal 20 receives a digital signal $S_I$ having 2-channel or single-channel serial data, and a shift register 24 sequentially receives the digital signals $S_I$ from the input terminal 20 for converting them into parallel data. A switch 25 is provided for determining the magnification or extent of oversampling. The switch 25 is switched between a four-times oversampling rate contact $25_4$ and a two-times oversampling rate contact $25_2$ in response to a magnification switching signal $S_C$. RAMs $26_L$ and $26_R$ are respectively connected to the same output of register 24 as contact $25_4$ and to the output of switch 25. When the signals $S_I$ are 2-channel signals, R- and L-channel signals are respectively written in the RAMS $26_R$ and $26_L$. When the signals $S_I$ are monaural signals, the data are sequentially written in both the RAMs $26_L$ and $26_R$. A switch 27 is provided for alternately deriving data read out from the RAMS $26_L$ and $26_R$ in accordance with a channel switching signal L/R, and the output data from the switch 27 is supplied to one input terminal of a multiplier 28. A ROM $29_C$ stores the C multiplication coefficient group and a ROM $29_F$ stores the F multiplication coefficient group. A switch 30 is provided for switching between the outputs from the ROMs $29_C$ and $29_F$ in response to the switching signal L/R. In the recording mode, the switch 30 is connected to a contact C to supply the C coefficient group from the ROM $29_C$ to another input terminal of the multiplier 28 in the L-channel A/D conversion mode. In the R-channel A/D conversion mode, the switch 30 is switched to a contact F to supply the F coefficient group from the ROM $29_F$ to the other input terminal of the multiplier 28. In the reproducing mode, the contacts C and F of the switch 30 are switched in a manner opposite to that described above for the recording mode.

An adder 31 is provided for adding the multiplication output from the multiplier 28 and a fed back output from an accumulator 32 provided for latching the result from the adder 31. A shift register 33 receives output data from the accumulator 32 and converts it into serial data applied to an output terminal 34 as an output signal $S_O$ derived from the shift register 33.

The operation of the above circuit arrangement will now be described.

In the 2-channel signal recording mode, the switch 25 is disposed to engage the contact $25_2$. Upon reception of the L-channel signal, the switch 27 engages its contact L and the switch 30 engages its contact C. The digital signal supplied from the input terminal 20 is delayed by a predetermined amount by the shift register 24 and the RAM $26_L$. Thereafter, the delayed signal is supplied to the multiplier 28 through the switch 27 to be sequentially multiplied with the corresponding multiplication coefficients 0, $C_1$, $C_2$, . . . from the ROM $29_C$. The multiplication output from the multiplier 28 is sequentially supplied to the adder 31, and is added therein to the immediately preceding multiplication output fed back from the accumulator 32. Such addition is repetitively performed. The output from the accumulator 32 is supplied to the shift register 33, and the content of the shift register 33 is obtained at the output terminal 34 as the desired L-channel digital signal.

Upon reception of the R-channel signal in the 2-channel signal recording mode, the switch 27 is switched to engage its contact R while the switch 30 is switched to engage its contact F. The digital signal from the input terminal 20 is delayed by a predetermined amount by the shift register 24, the switch 25, and the RAM $26_R$, and is supplied to the multiplier 28 through the switch 27 to be sequentially multiplied with the corresponding multiplication coefficients $F_1$, $F_2$, . . . from the ROM $29_F$. The multiplication output from the multiplier 28 is again supplied to the adder 31, and is added therein to the feedback input from the accumulator 32, with such addition being repetitively performed. The output from the accumulator 32 is supplied to the shift register 33, and the content of the shift register 33 is obtained at the output terminal 34 as the desired R-channel digital signal.

In the 2-channel signal reproducing mode, the switches 27 and 30 are switched in a manner opposite to that described above, and the same operation as above is performed.

With the above described operation in the 2-channel signal recording and reproducing modes, the digital filter is operated at the double sampling rate, and at this time, the filter characteristics shown in FIG. 2C are obtained.

When the single-channel signal $S_I$ is supplied to the input terminal 20, the switch 25 is changed-over to engage the contact $25_4$. In the single-channel signal recording and reproducing modes, the data from the shift register 24 are sequentially written in the RAMs $26_R$ and $26_L$, and are supplied to the switch 27 which is alternately switched or changed-over between its contacts L and R. The ROMs $29_C$ and $29_F$ are alternately subjected to read access, and the coefficients of the C and F coefficient groups are alternately supplied to the multiplier 28 through the switch 30. Apart from the foregoing, the same operations are performed as have been described above in the case of the 2-channel signal, and the output signal $S_O$ can be obtained from the output terminal 34.

As described above, for the single-channel signal the digital filter is operated at four-times the normal sampling rate, and at this time, the filter characteristics shown in FIG. 7A can be obtained.

It should be noted that the single-channel signal can be one of the 2-channel signals and, in that event, another digital filter having the circuit arrangement shown in FIG. 8 is used for the other channel signal. In this case, the 2-channel signal can be oversampled at a sampling rate $4f_s$.

Therefore, the C and F coefficient groups defining the filter characteristics of the digital filter need only be switched in accordance with the recording/reproducing mode and the L-/R-channel signals. A phase difference between the 2-channel signals output from the digital filter can be removed in the recording mode, and a phase of one channel signal output from the digital filter to the D/A converter can be delayed from that of the other channel signal in the reproducing mode. By using the same circuit arrangement, the magnification or extent of oversampling for the single-channel signal can be changed.

Although an illustrative embodiment of the invention has been described in detail with reference to the accompanying drawings, it is to be understood that the invention is not limited to that precise embodiment, and that various changes and modifications may be effected therein by one skilled in the art without departing from the scope or spirit of the invention as defined in the appended claims.

What is claimed is:

1. A digital filter for a recording/reproducing apparatus comprising:
   analog-to-digital and digital-to-analog converter means for 2-channel signals;
   means for storing first and second multiplication coefficient groups which provide predetermined filter characteristics and are in interpolated relation to each other; and
   signal processing means operative, in a recording mode, to employ the first multiplication coefficient group for processing one of said 2-channel signals and to employ the second multiplication coefficient group for processing the other of said 2-channel signals, said signal processing means being operative, in a reproducing mode to employ the second multiplication coefficient group for processing said one channel signal, and to employ the first multiplication coefficient group for processing said other channel signal.

2. A digital filter according to claim 1, wherein, in recording and reproducing modes for a single-channel signal, the first and second multiplication coefficient groups are alternately employed by said signal processing means for successive samplings of said single-channel signal.

3. A digital filter according to claim 1, wherein said converter means oversample an input signal thereto.

4. A digital filter according to claim 3, wherein said filter has a predetermined impulse response characteristic curve, and
   said interpolated first and second multiplication coefficient groups are alternately offset from each other at an interval corresponding to $\frac{1}{2}$ of an oversampling period on said impulse response characteristic curve of said digital filter.

5. A digital filter according to claim 1, further comprising first delay means receiving said one channel signal, second delay means receiving said other channel signal, selection means for alternately selecting output signals from said first and second delay means as an output signal from said selection means, and arithmetic means for multiplying said output signal from said selection means with coefficients of said first or second multiplication coefficient groups and performing predetermined arithmetic processing thereon.

6. A digital filter according to claim 5, wherein one of said said first and second delay means is used for a single-channel input signal, and an output signal from said one delay means is supplied to said arithmetic means.

7. A digital filter according to claim 5, wherein said arithmetic means includes multiplier means for effecting said multiplying of said output signal from said selection means with said coefficients of the first or second multiplication coefficient groups and providing a multiplied output, adder means having a first input receiving said multiplied output from said multiplier means and a second input, and accumulator means latching an output of said adder means and providing a latched output applied to said second input of the adder means.

* * * * *